(12) United States Patent
Nishibe

(10) Patent No.: US 6,542,045 B2
(45) Date of Patent: Apr. 1, 2003

(54) HIGH-FREQUENCY VARIABLE ATTENUATOR HAVING A CONTROLLABLE REFERENCE VOLTAGE

(75) Inventor: Toshiaki Nishibe, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 09/760,625

(22) Filed: Jan. 16, 2001

(65) Prior Publication Data

US 2001/0028282 A1 Oct. 11, 2001

(30) Foreign Application Priority Data

Jan. 17, 2000 (JP) ........................................ 2000/007782

(51) Int. Cl.[7] .............................................. H01P 1/22
(52) U.S. Cl. .................................... 333/81 R; 327/309
(58) Field of Search ..................... 333/81 R; 330/284, 330/144; 327/309

(56) References Cited

U.S. PATENT DOCUMENTS

| | | | | |
|---|---|---|---|---|
| 3,673,492 A | * | 6/1972 | Gilson | 323/355 |
| 4,839,611 A | | 6/1989 | Kukulinsky | 330/284 |
| 4,975,604 A | * | 12/1990 | Barta | 327/308 |
| 5,087,899 A | | 2/1992 | Lauper | 333/81 R |

FOREIGN PATENT DOCUMENTS

| | | |
|---|---|---|
| JP | 59-134928 | 9/1984 |
| JP | 63-312708 | 12/1988 |
| JP | 6-69754 | 3/1994 |
| JP | 6-77762 | 3/1994 |
| JP | 6-216688 | 8/1994 |
| JP | 9-265786 | 10/1997 |
| JP | 10-126176 | 5/1998 |
| JP | 10-242812 | 9/1998 |
| JP | 11-168395 | 6/1999 |
| JP | 10-261925 | 6/2000 |
| WO | WO99/56389 | 11/1999 |

* cited by examiner

*Primary Examiner*—Robert Pascal
*Assistant Examiner*—Joseph Chang
(74) *Attorney, Agent, or Firm*—Choate, Hall & Stewart

(57) ABSTRACT

In a high-frequency variable attenuator for variably attenuating an input high-frequency signal in response to a control voltage to produce an output high-frequency signal, a reference voltage generating circuit generates a controllable reference voltage in response to the control voltage. Connected to the reference voltage generating circuit, an attenuating circuit attenuates the input high-frequency signal on the basis of the control voltage in reference with the controllable reference voltage to produce the output high-frequency signal.

8 Claims, 13 Drawing Sheets

HIGH-FREQUENCY VARIABLE ATTENUATOR HAVING A CONTROLLABLE REFERENCE VOLTAGE

BACKGROUND OF THE INVENTION

This invention relates to a high-frequency variable attenuator for use in a radio communication circuit such as a portable telephone set and, more particularly, to a high-frequency variable attenuator including an attenuating circuit for attenuating an input high-frequency signal in response to a control voltage to produce an output high-frequency signal and a reference voltage generating circuit for supplying the attenuating circuit with a reference voltage.

In the manner which is well known in the art, a high-frequency variable attenuator of the type is for use in a radio communication circuit such as a portable telephone set and is implemented by a monolithic microwave integrated circuit. The high-frequency variable attenuator variably attenuates an input high-frequency signal in response to a control voltage to produce an output high-frequency signal. More specifically, the high-frequency variable attenuator comprises an attenuating circuit and a reference voltage generating circuit. The reference voltage generating circuit generates a reference voltage to supply the attenuating circuit with the reference voltage. The attenuating circuit has an input terminal supplied with the input high-frequency signal, an output terminal for producing the output high-frequency signal, and a control terminal supplied with the control voltage. On the basis of the control voltage, the attenuating circuit attenuates the input high-frequency signal in reference with the reference voltage to produce the output high-frequency signal.

The attenuating circuit includes an attenuator field effect transistor The attenuator field effect transistor has a gate terminal connected to the control terminal through a first attenuator resistor, a drain terminal connected to the input terminal through a first attenuator capacitor, a source terminal connected to the output terminal through a second attenuator capacitor. The reference voltage is supplied to the drain terminal and the source terminal of the attenuator field effect transistor through second and third attenuator resistors, respectively. Each of the second and the third attenuator resistors has a high resistance value. In addition, each of the first and the second attenuator capacitors plays a role for cutting off a direct current (DC) component.

In the manner which will later be described in conjunction with FIG. 1, a conventional high-frequency variable attenuator comprises a conventional reference voltage generating circuit for generating, as the reference voltage, a fixed reference voltage. In other words, a difference voltage between the control voltage and the reference voltage varies in dependency on only the control voltage. That is, the difference voltage is determined in response to the control voltage alone so as to have a constant variation amount.

More specifically, the conventional reference voltage generating circuit has a power-supply terminal supplied with a power-supply voltage and a ground terminal supplied with a ground voltage. The reference voltage generating circuit consists of a resistive potential divider. The resistive potential divider comprises first and second divider resistors which are connected in series between the power supply terminal and the ground terminal. The reference voltage generating circuit has a reference connection node between the first and the second divider resistors that generates a divided voltage as the fixed reference voltage.

Inasmuch as the difference voltage between the control voltage and the fixed reference voltage is determined so as to have the constant variation amount in the manner which is described above, in a case where the field effect transistor has a fixed structure, the conventional high-frequency variable attenuator has an attenuation amount having a slope which is uniquely determined in the manner which will later be described in conjunction with FIG. 2. In addition, the conventional high-frequency variable attenuator is disadvantageous in that the attenuation amount has variations with respect to a threshold voltage of the attenuator field effect transistor in the manner which will later be also described in conjunction with FIG. 2.

Various high-frequency variable attenuators of the type are already known. By way of example, Japanese Unexamined Utility Model Publication Jikkai No. Sho 59-134,928 or JP-U 59-134928 discloses a variable attenuator which comprises a first transistor connected between an input terminal and an output terminal, a first series circuit and a second series circuit. The first series circuit is connected between the input terminal and a common line and consists of a first resistor and a second transistor. The second series circuit is connected between the output terminal and the common line and consists of a second resistor and a third transistor. By varying direct current biases supplied to the first through the third transistors, an attenuation amount between the input terminal and the output terminal is varied.

Japanese Unexamined Patent Publication (JP-A) Tokkai No. Sho. 63-312,708 or JP-A 63-312708 discloses a variable attenuator which comprises first through third field effect transistors connected to each other in a π-shape fashion, and a plurality of resistors or diodes connected to gates sources, and drains of the first through the third field effect transistors. In the variable attenuator, two different negative control voltages are controlled by a positive fixed power source and a positive controllable power source. In other words, the variable attenuator disclosed in the JP-A 63-312708 is a π-type attenuator which has an attenuation amount control terminal, a constant voltage supplying terminal, a high-frequency signal input terminal, and a high-frequency signal output terminal.

Furthermore, Japanese Unexamined Patent Publication (JP-A) Tokkai No. Hei 6-69,754 or JP-A 6-69754 discloses a constant-resistance type variable attenuator in which a tertiary cross modulation distortion characteristic is improved by varying the gate width of a plurality of FETs applying control voltage on a gate so as to constitute the variable attenuator. More specifically, the bridged T type variable attenuator consists of a first field effect transistor (FET), first and second resistors, and a second FET. The first FET has a drain and a source connected to an input terminal and an output terminal for a microwave signal, and a gate connected to a first control terminal. The first resistor has one end connected to the drain of the first FET while the second resistor has one end connected to the source of the first FET. The first and the second resistors have other end connected to a common connection point in common. The second FET has a drain connected to the common connection point. a source grounded, and a gate connected to a second control terminal. The gate width of the second FET is enlarged so that the gate width of the first FET differs from that of the second FET. The saturated voltage of drain current upon the impression of the gate voltage around pinch-off increases as compared with the source voltage of the first FET, and the distortion characteristic of the second FET is improved.

Japanese Unexamined Patent Publication (JP-A) Tokkai No. Hei 6-77,762 or JP-A 6-77762 discloses a variable attenuator by incorporating a field effect transistor (FET) improved in mutual modulation distortion characteristics in a microwave integrated circuit concerning the variable attenuator for preparing the variable attenuating amount of microwaves by applying a control voltage to the gate of the FET The variable attenuator disclosed in JP-A 6-77762 comprises a field effect transistor (FET) and a choke coil. The FET has a source grounded, a drain connected to a signal line connecting between an input and an output, a gate connected to a control voltage terminal. A power source terminal is connected through the choke coil to the drain of the FET. When the control voltage is close to a threshold voltage of the FET and when the power supply terminal is biased, the non-linearity of the FET is relaxed and the mutual modulation distortion characteristic can be improved In addition, Japanese Unexamined Patent Publication (JP-A) Tokkai No. Hei 9-265,786 or JP-A 9-265786 discloses a semiconductor storage which is capable of preventing erroneous read-out and of securing stable circuit operation by providing a negative feedback amplifier circuit containing circuit elements related to output decision in a feedback loop in a gate voltage generation circuit. In JP-A 9-265786, the gate voltage generation circuit comprises a reference voltage generation circuit, first and second differential amplifier circuits, and first and second divider circuits. The reference voltage generation circuit generates a reference voltage. The first and the second differential amplifier circuits are activated in response to a supply of an activation signal. The first and the second differential amplifiers amplify receiving the supply of the reference voltage to produce first and second differential output voltages, respectively. The first divider circuit receives the supply of the first differential output voltage and feeds back a first feedback voltage to the first differential amplifier circuit. The second divider circuit receives the supply of the second differential output voltage and feeds back a second feedback voltage to the second differential amplifier circuit. By such a constitution, dispersion in threshold voltages of the circuit elements of the first and the second differential amplifier circuits and the first and the second divider circuits are canceled, and the first and the second feedback voltages become equal to the reference voltage. Further, even when a source voltage is fluctuated, gate voltages are generated without being affected by that.

Furthermore, Japanese Unexamined Patent Publication (JP-A) Tokkai No. Hei 10-242,812 or JP-A 10-242812 discloses a semiconductor circuit which is capable of setting impedance so as not be affected by the concentration of a diffusion layer or the like. The semiconductor circuit disclosed in JP-A 10-242812 is provided with first and second I-type NMOS transistors connected in series between a power supply voltage point and ground. The first NMOS transistor has a gate terminal connected to a point of a reference voltage lower than a power supply voltage. The second NMOS transistor has a gate terminal to which the power supply voltage is applied. The second NMOS transistor has a drain voltage which is nearly equal to the reference voltage and the second NMOS transistor is acted in a linear region. Thus, the second NMOS transistor is used for an impedance element and it is not required to provide a resistive element separately and the effect by the concentration of a diffusion layer and a power supply voltage is avoided.

Japanese Unexamined Patent Publication (JP-A) Tokkai No. Hei 11-168,395 or JP-A 11-168395 discloses a transmission power control circuit which is capable of preventing unrequired transmission in the case that communication is not established. The transmission power control circuit disclosed in JP-A 11-168395 includes a variable attenuator, a control circuit, first and third reference voltage circuits, and a reference voltage switching circuit. The reference voltage switching circuit has a function for switching the first through the third reference voltage circuits for the control circuit. The control circuit controls the attenuation amount of the variable attenuator so as to output transmission power corresponding to the reference voltage.

SUMMARY OF THE INVENTION

It is therefore an object of this invention to provide a high-frequency variable attenuator which is capable of arbitrarily setting a slope of an attenuation curve indicative of an attenuation amount of an attenuating circuit with respect to a control voltage supplied to the attenuating circuit.

It is another object of this invention to provide a high-frequency variable attenuator of the type described, which is capable of suitably setting the attenuation amount in the attenuating circuit by suitably correcting the attenuation curve using a reference voltage supplied from a reference voltage generating circuit although there are variations in a threshold voltage of a field effect transistor, ambient temperature, or the like.

Other objects of this invention will become clear as the description proceeds.

On describing the gist of an aspect of this invention, it is possible to be understood that a high-frequency variable attenuator variably attenuates an input high-frequency signal in response to a control voltage to produce an output high-frequency signal.

According to a first embodiment of this invention, the above-understood high-frequency variable attenuator comprises a reference voltage generating circuit for generating a controllable reference voltage in response to the control voltage. Connected to the reference voltage generating circuit, an attenuating circuit attenuates the input high-frequency signal on the basis of the control voltage in reference with the controllable reference voltage to produce the output high-frequency signal.

According to a second aspect of this invention, the above-understood high-frequency variable attenuator comprises an attenuating circuit for attenuating the input high-frequency signal on the basis of the control voltage in reference with a controllable reference voltage to produce the output high-frequency signal. The attenuating circuit includes an attenuator field effect transistor having a threshold voltage. Connected to the attenuating circuit, a reference voltage generating circuit generates the controllable reference voltage so as to correct variations in the threshold voltage.

According to a third aspect of this invention, the above-understood high-frequency variable attenuator comprises an attenuating circuit for attenuating the input high-frequency signal on the basis of the control voltage in reference with a controllable reference voltage to produce the output high-frequency signal. The attenuating circuit includes an attenuator field effect transistor having a threshold voltage. The attenuating circuit has an attenuation amount determined by the threshold voltage and a difference voltage between the control voltage and the controllable reference voltage. The attenuation amount is represented by an attenuation curve which depends on the control voltage and the threshold voltage. Connected to the attenuating circuit, a reference voltage generating circuit generates, in response to the control voltage, the controllable reference voltage so as to determine a slope of the attenuation curve.

DESCRIPTION OF THE PREFERRED EMBODIMENTS

Figure 1:
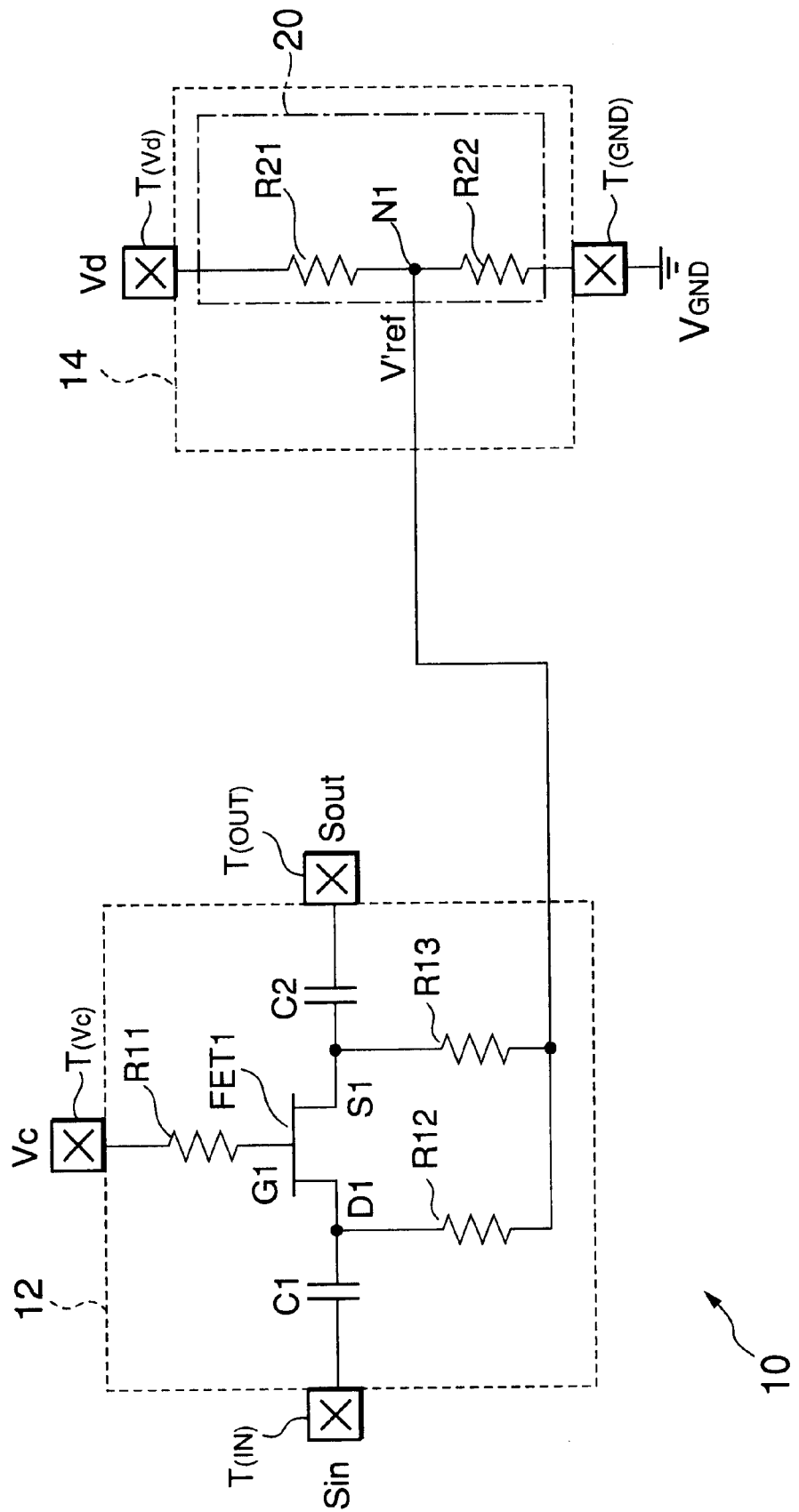
FIG. 1 is a block diagram of a conventional high-frequency variable attenuator.

Referring to FIG. 1, a conventional high-frequency variable attenuator 10 will be described at first in order to facilitate an understanding of the present invention. The illustrated high-frequency variable attenuator 10 variably attenuates an input high-frequency signal Sin in response to a control voltage Vc to produce an output high-frequency signal Sout.

The high-frequency variable attenuator 10 comprises an attenuating circuit 12 and a reference voltage generating circuit 14 which is called a control circuit. In the manner which will later become clear, the reference voltage generating circuit 14 generates a reference voltage V'ref to supply the attenuating circuit 10 with the reference voltage V'ref.

The attenuating circuit 12 has an input terminal T(IN) supplied with the input high-frequency signal Sin, an output terminal T(OUT) for producing the output high-frequency signal Sout, and a control terminal T(Vc) supplied with the control voltage Vc from an external device (not shown). On the basis of the control voltage Vc, the attenuating circuit 12 attenuates the input high-frequency signal Sin in reference with the reference voltage Vref to produce the output high-frequency signal Sout.

More specifically, the attenuating circuit 12 includes a first field effect transistor FET1 which is called an attenuator field effect transistor. The first field effect transistor FET1 has a first gate terminal G1 connected to the control terminal T(Vc) through a first attenuator resistor R11, a first drain terminal D1 connected to the input terminal T(IN) through a first attenuator capacitor C1, a first source terminal S1 connected to the output terminal T(OUT) through a second attenuator capacitor C2. The reference voltage V'ref is supplied to the first drain terminal D1 and the first source terminal S1 of the first field effect transistor FET1 through second and third attenuator resistors R12 and R13, respectively. Each of the second and the third attenuator resistors R12 and R13 has a high resistance value. In addition, each of the first and the second attenuator capacitors C1 and C2 plays a role for cutting off a direct current (DC) component.

On the other hand, the reference voltage generating circuit 14 generates, as the reference voltage V'ref, a fixed reference voltage. In other words, a difference voltage $\Delta V$ between the control voltage Vc and the reference voltage V'ref varies in dependency on the control voltage Vc alone. That is, the difference voltage $\Delta V$ is determined in response to the control voltage Vc alone so as to have a constant slope for a variation amount.

More specifically, the reference voltage generating circuit 14 has a power-supply terminal T(Vd) supplied with a power-supply voltage Vd and a ground terminal T(GND) supplied with a ground voltage $V_{GND}$. The reference voltage generating circuit 14 consists of a resistive potential divider 20. The resistive potential divider 20 comprises first and second divider resistors R21 and R22 which are connected in series between the power-supply terminal T(Vd) and the ground terminal V(GND). The resistive potential divider 20 has a first reference connection node N1 between the first and the second divider resistors R21 and R22 that generates a divided voltage as the fixed reference voltage V'ref. The first reference connection node N1 is called a divider reference connection node.

Figure 2:
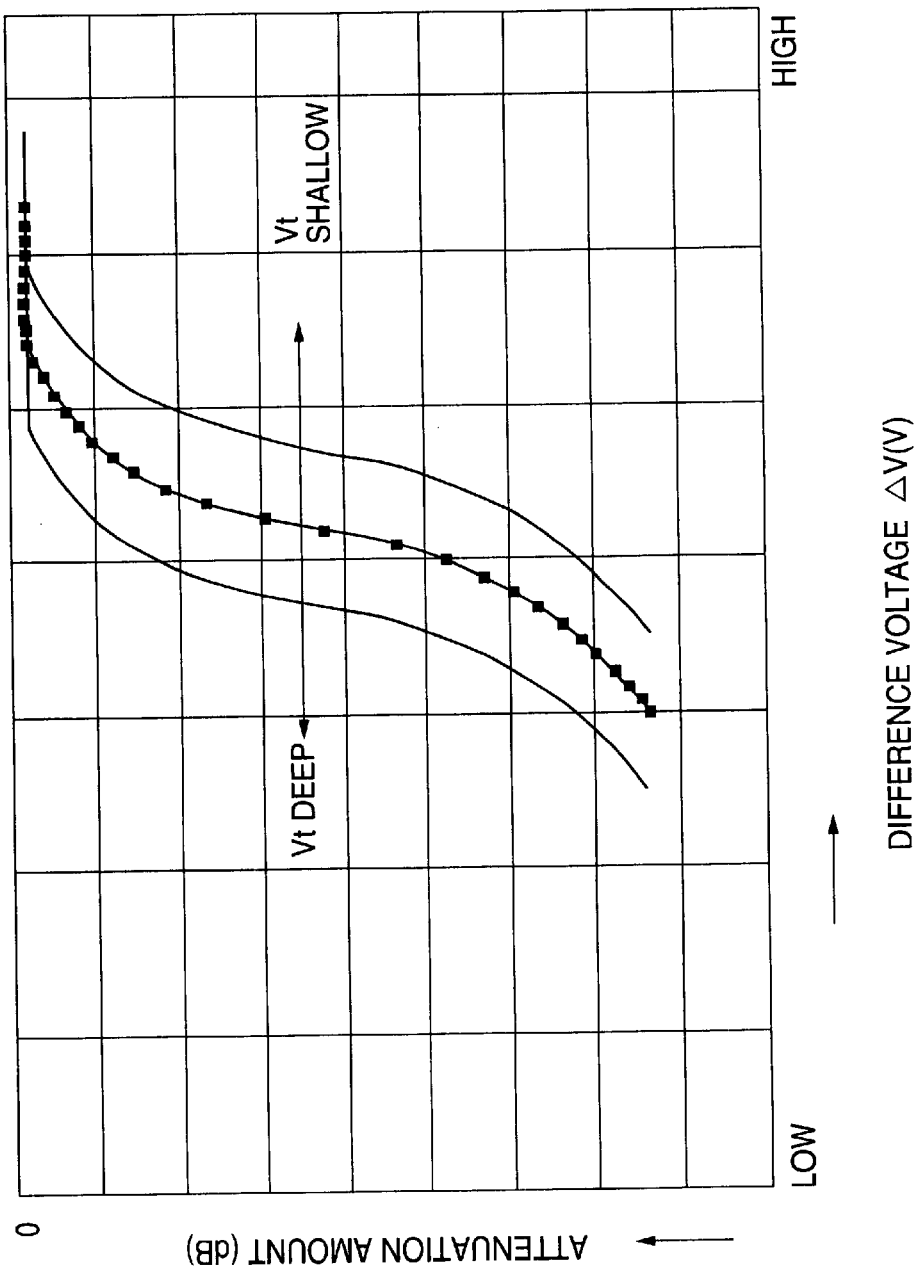
FIG. 2 shows a characteristic of a difference voltage versus an attenuating amount of an attenuating circuit in the conventional high-frequency variable attenuator illustrated in FIG. 1.

FIG. 2 shows a characteristic of the difference voltage $\Delta V$ (V) versus an attenuation amount (dB) of the attenuating circuit 12 in the high-frequency variable attenuator 10 illustrated in FIG. 1. In FIG. 2, the abscissa and the ordinate represent the difference voltage $\Delta V$ (V) and the attenuation amount (dB), respectively.

Inasmuch as the fixed reference voltage V'ref is supplied from the reference voltage generating circuit 14 to the attenuating circuit 12 in the conventional high-frequency variable attenuator 10. the difference voltage $\Delta V$ between the control voltage Vc and the fixed reference voltage V'ref is determined so as to have the constant slope for the variation amount in the manner which is described above. This is because the difference voltage $\Delta V$ varies in dependency on the control voltage Vc alone. Accordingly, in a case where the first field effect transistor FET1 has a fixed structure as illustrated in FIG. 1, the high-frequency variable attenuator 10 has the attenuation amount represented by an attenuation curve having a slope which is uniquely determined as illustrated in FIG. 2, as mentioned in the preamble of the instant specification.

In the manner which is well known in the art, the first field effect transistor FET1 has a threshold voltage Vt. As illustrated in FIG. 2, the attenuation curve of the high-frequency variable attenuator 10 shifts leftward in FIG. 2 when the threshold voltage Vt of the first field effect transistor FET1 is high or deep while the attenuation curve of the high-frequency variable attenuator 10 shifts rightward in FIG. 2 when the threshold voltage Vt of the first field effect transistor FET1 is low or shallow. Accordingly, the conventional high-frequency variable attenuator 10 is disadvantageous in that the attenuation amount has variations with respect to the threshold voltage Vt of the first field effect transistor FET1, as mentioned also in the preamble of the instant specification.

Figure 3:
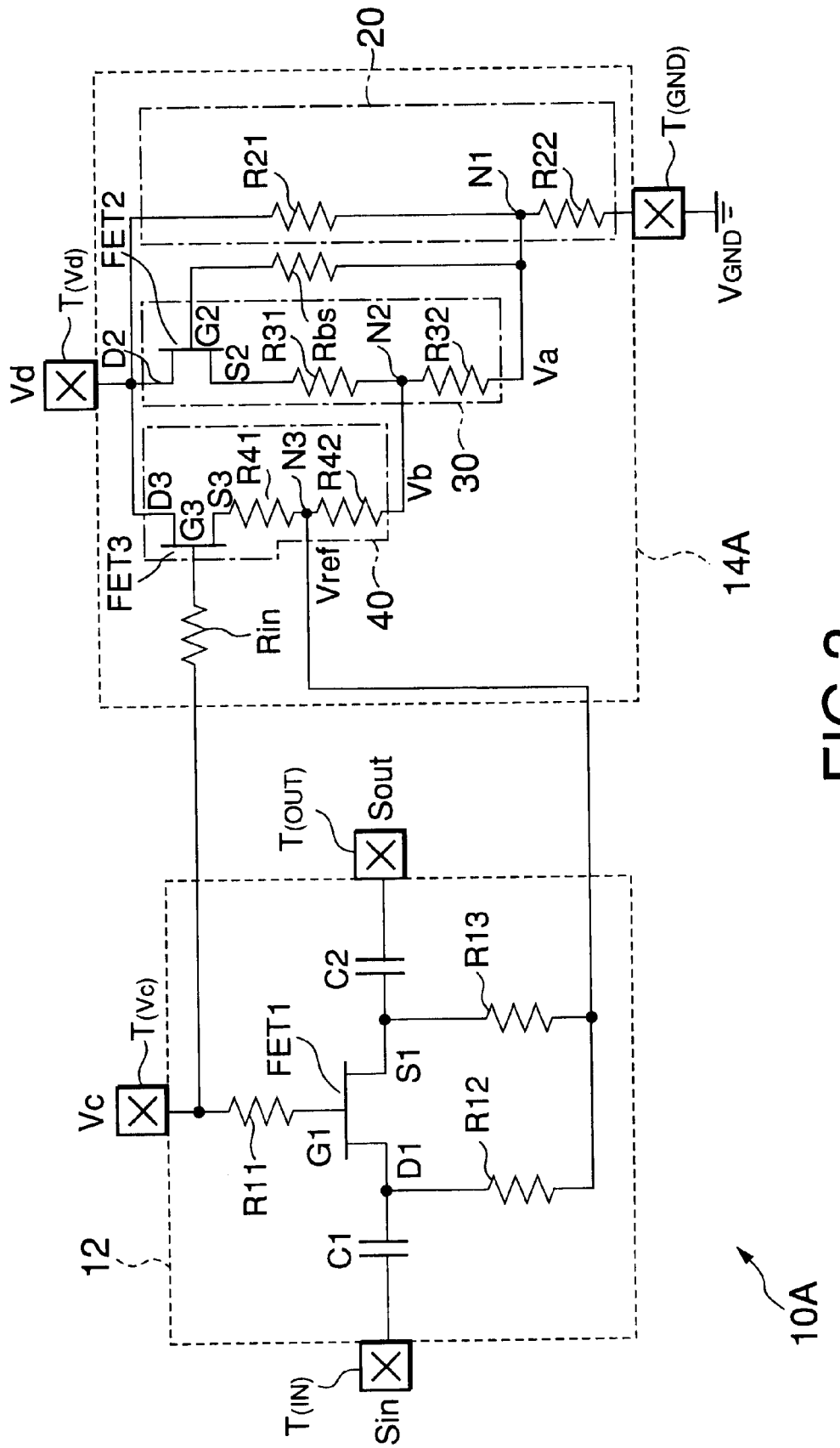
FIG. 3 is a block diagram of a high-frequency variable attenuator according to a first embodiment of this invention.

Referring to FIG. 3, the description will proceed to a high-frequency variable attenuator 10A according to a first embodiment of this invention. The illustrated high-frequency variable attenuator 10A is similar in structure to that illustrated in FIG. 1 except that the reference voltage generating circuit is modified to be different from that described in conjunction with FIG. 1 in the manner which will later become clear. The reference voltage generating circuit is therefore depicted at 14A.

The reference voltage generating circuit 14A is connected to the control terminal T(Vc) as well as to the power-supply terminal T(Vd) and the ground terminal V(GND). That is, the reference voltage generating circuit 14A is supplied with the control voltage Vc from the control terminal T(Vc). In the manner which will become clear as the description proceeds, the reference voltage generating circuit 14A generates a controllable reference voltage Vref in response to the control voltage Vc. In other words, the controllable reference voltage Vref is a variable reference voltage Vref which varies in response to the control voltage Vc.

More specifically, the reference voltage generating circuit 14A comprises not only the resistive potential divider 20 but also an input resistor Rin, a bias resistor Rbs, a variation correcting circuit 30, and a slope determining circuit 40. Each of the input resistor Rin and the bias resistor Rbs has a high resistance value.

In the manner which is described above, the resistive potential divider 20 comprises the first and the second divider resistors R21 and R22 which are connected in series between the power-supply terminal T(Vd) and the ground terminal V(GND). The resistive potential divider 20 has the first reference connection node N1 between the first and the second divider resistors R21 and R22 that generates the divided voltage depicted at Va. The first reference connection node N1 is also called the divider reference connection node as described above. The divided voltage Va is supplied to the variation correcting circuit 30.

The variation correcting circuit 30 is connected between the power-supply terminal T(Vd) and the first or the divider reference connection node N1. The variation correcting circuit 30 comprises a second field effect transistor FET2, first and second correction resistors R31 and R32. The second field effect transistor FET2 is called a correction field effect transistor. The second field effect transistor FET2 has a threshold voltage which is substantially equal to that of the first or the attenuator field effect transistor FET1. The second field effect transistor FET2 has a second gate terminal G2 connected to the first or the divider reference connection node N1 through the bias resistor Rbs, a second drain terminal D2 connected to the power-supply terminal T(Vd), and a second source terminal S2. The first and the second correction resistors R31 and R32 are connected in series between the second source terminal S2 of the second field effect transistor FET2 and the first or the divider reference connection node N1. Specifically, the first correction resistor R31 has one end connected to the second source terminal S2 of the second field effect transistor FET2 and another end connected to one end of the second correction resistor R32. The second correction resistor R32 has another end connected to the first or the divider reference connection node N1.

The variation correcting circuit 30 has a second reference connection node N2 between the first and the second correction resistors R31 and R32 that generates a corrected voltage Vb in the manner which will become clear as the description proceeds. The second reference connection node N2 is called a correction reference connection node. The corrected voltage Vb is determined by a gate width of the second field effect transistor FET2 and resistance values of the first and the second correction resistors R31 and R32. In addition, the corrected voltage Vb varies due to variations of the threshold voltage of the field effect transistor by a function of the second field effect transistor FET2. Specifically, the corrected voltage Vb descends when the threshold voltage of the field effect transistor is shallow or low. When the threshold voltage of the field effect transistor is deep or high, the corrected voltage Vb ascends. At any rate, the variation correcting circuit 30 corrects the variations in the threshold voltage of the field effect transistor to produce the corrected voltage Vb. The corrected voltage Vb is supplied to the slope determining circuit 40.

The slope determining circuit 40 is connected to the control terminal T(Vc) through the input resistor Rin. In addition the slope determining circuit 40 is connected between the power-supply terminal T(Vd) and the second or the correction reference connection node N2. The slope determining circuit 40 comprises a third field effect transistor FET3, and first and second determination resistors R41 and R42. The third field effect transistor FET3 is called a determination field effect transistor. The third field effect transistor FET3 has a third gate terminal G3 connected to the control terminal T(Vc) through the input resistor Rin, a third drain terminal D3 connected to the power-supply terminal T(Vd), and a third source terminal S3. The first and the second determination resistors R41 and R42 are connected in series between the third drain terminal D3 of the third field effect transistor FET3 and the second or the correction reference connection node N2. Specifically, the first determination resistor R41 has an end connected to the third source terminal S3 of the third field effect transistor FET3 and another end connected to an end of the second determination resistor R42. The second determination resistor R42 has another and connected to the second or the correction reference connection node N2.

The slope determining circuit 40 has a third reference connection node N3 between the first and the second determination resistors R41 and R42 that generates a determined voltage as the controllable reference voltage Vref in the manner which will become clear as the description proceeds. The third reference connection node N3 is called a determination reference connection node. When the control voltage Vc varies, the controllable reference voltage Vref also directly varies. The controllable reference voltage Vref is determined by a gate width of the third field effect transistor FET3 and resistance values of the first and the second determination resistors R41 and R42. In addition, a variable amount of the controllable reference voltage Vref for the control voltage Vc is determined by a resistance ratio of the first and the second determination resistors R41 and R42 in a case where the third field effect transistor FET3 has a fixed gate width. At any rate, the slope determining circuit 40 determines, in response to the control voltage Vc, a slope of an attenuation curve indicative of the attenuation amount in the attenuating circuit 12 to produce the controllable reference voltage Vref.

Figure 4:
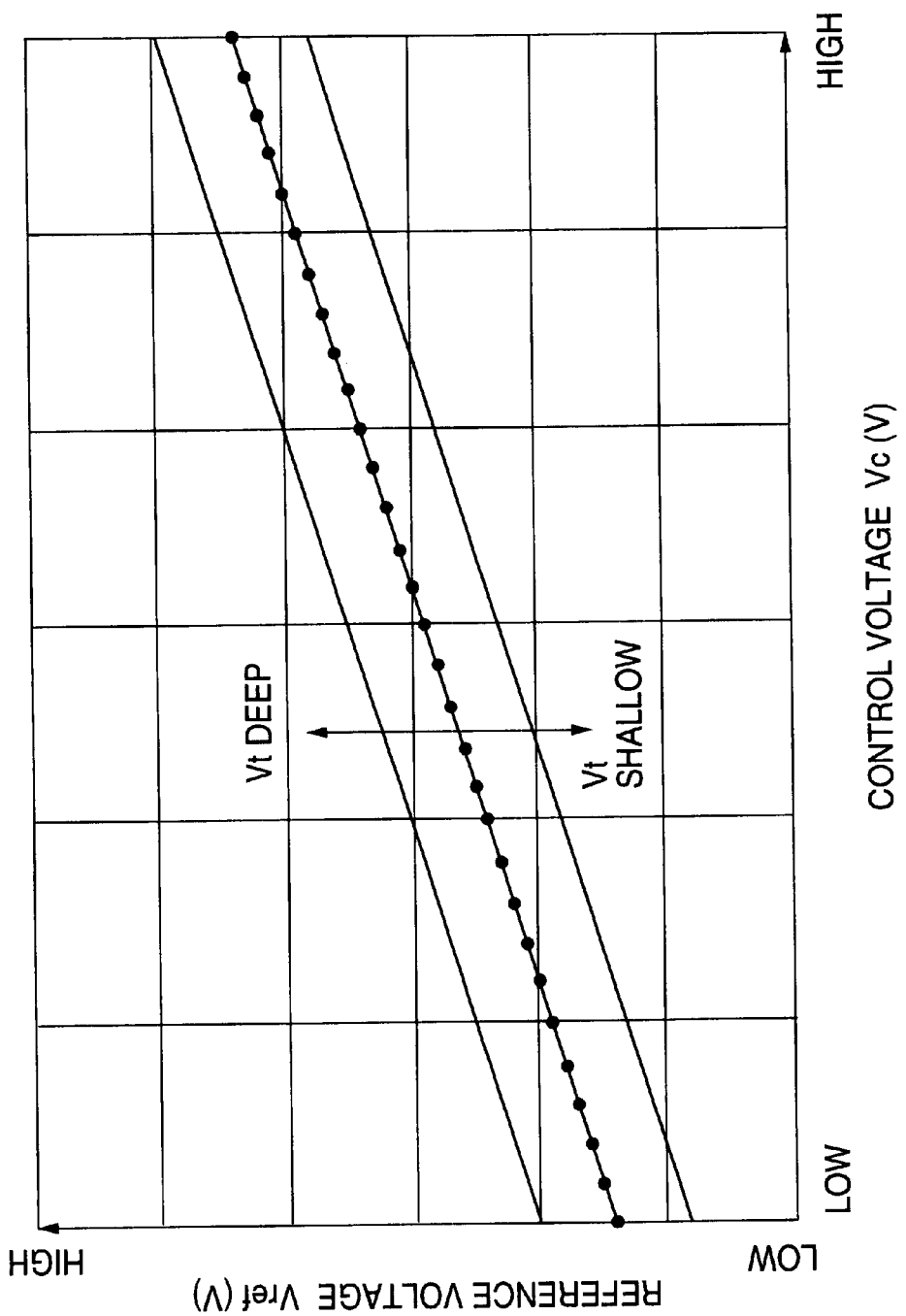
FIG. 4 shows a characteristic of a control voltage versus a reference rev voltage in the high-frequency variable attenuator illustrated in FIG. 3.

FIG. 4 shows a characteristic of the control voltage Vc (V) versus the controllable reference voltage Vref (V) in the high-frequency variable attenuator 10A illustrated in FIG. 3.

In FIG. 4, the abscissa or the X-axis and the ordinate or the Y-axis represent the control voltage Vc (V) and the controllable reference voltage Vref (V), respectively.

In the manner which is described above, the controllable reference voltage Vref or the determined voltage is determined by the gate width of the third field effect transistor FPT3 as well as the resistance values of the first and the second determination resistors R41 and R42. In addition, the corrected voltage Vb is determined by the gate width of the second field effect transistor FET2 as well as the resistance values of the first and the second correction resistors R31 and R32.

It will be assumed that each of the second and the third field effect transistors FET2 and FET3 has a fixed gate width. Under the circumstances, the corrected voltage Vb on y-intercept in FIG. 4 is determined by the resistance values of the first and the second divider resistors R21 and R22. In addition, a curve indicative of the controllable reference voltage Vref has a slope which is determined by the resistance values of the first and the second determination resistors R41 and R42. Furthermore, a variation amount for the threshold voltage Vt is determined by the resistance values of the first and the second correction resistors R31 and R32.

Figure 5:
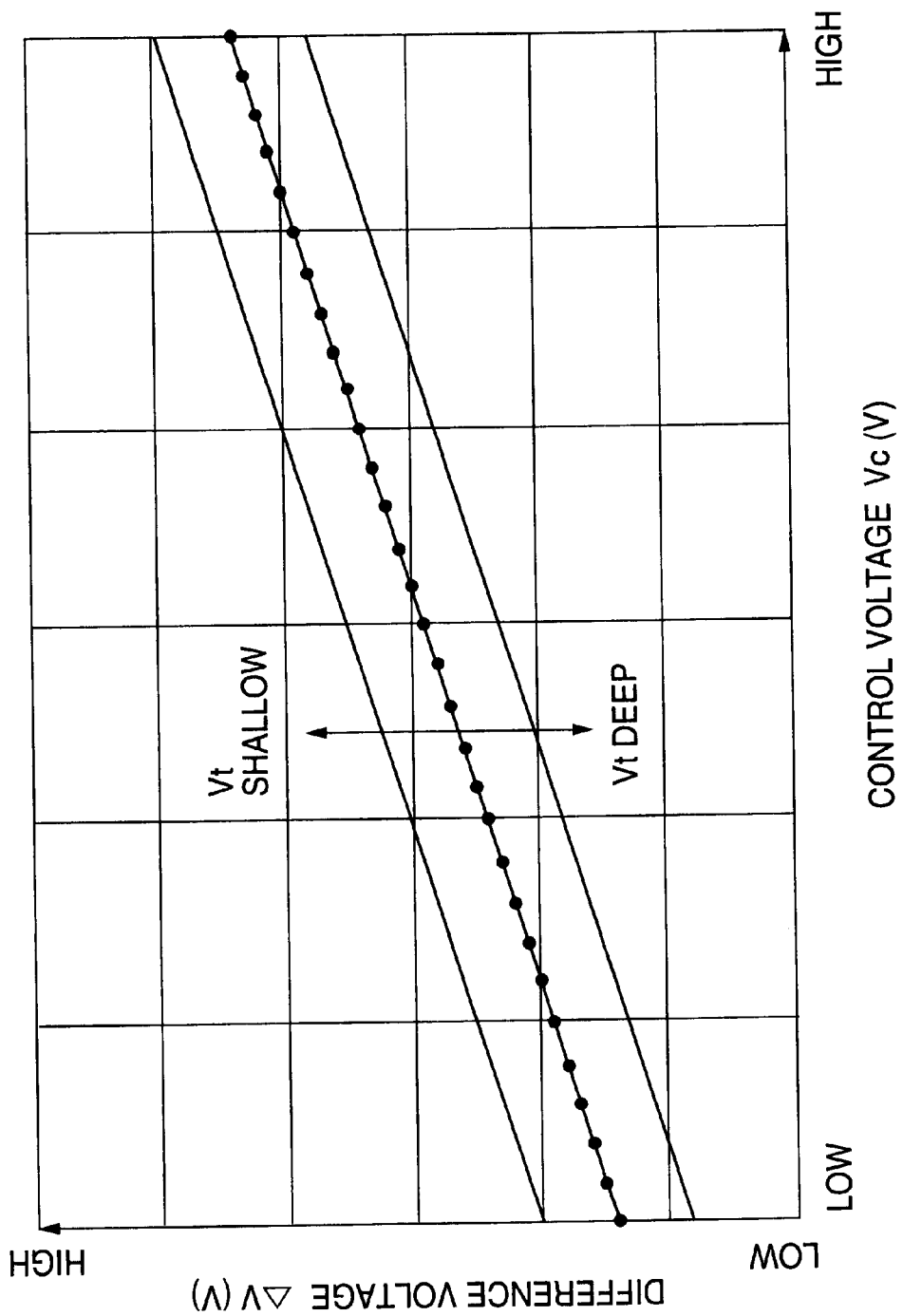
FIG. 5 shows a characteristic of a control voltage versus a difference voltage in the high-frequency variable attenuator illustrated in FIG. 3.

FIG. 5 shows a characteristic of the control voltage Vc (V) versus the difference voltage ΔV (V) in the high-frequency variable attenuator 10A illustrated in FIG. 3. In FIG. 5, the abscissa or the X-axis and the ordinate or the Y-axis represent the control voltage Vc (V) and the difference voltage ΔV (V), respectively. The difference ΔV (V) is a voltage obtained by subtracting the controllable reference voltage Vref from the control voltage Vc. That is:

ΔV=Vc−Vref.

In the manner which is apparent from FIG. 5, the difference voltage ΔV descends when the threshold voltage Vt of the field effect transistor is high or deep while the difference voltage ΔV ascends when the threshold voltage Vt of the field effect transistor is low or shallow. On the basis of this operation and relationship between the difference voltage ΔV and the attenuation amount illustrated in FIG. 2, it is possible to absorb or correct the variations in the threshold voltage Vt of the field effect transistor. In addition, it is possible to arbitrarily select or determine the slope of the attenuation curve indicative of the attenuation amount for the control voltage Vc.

Figure 6:
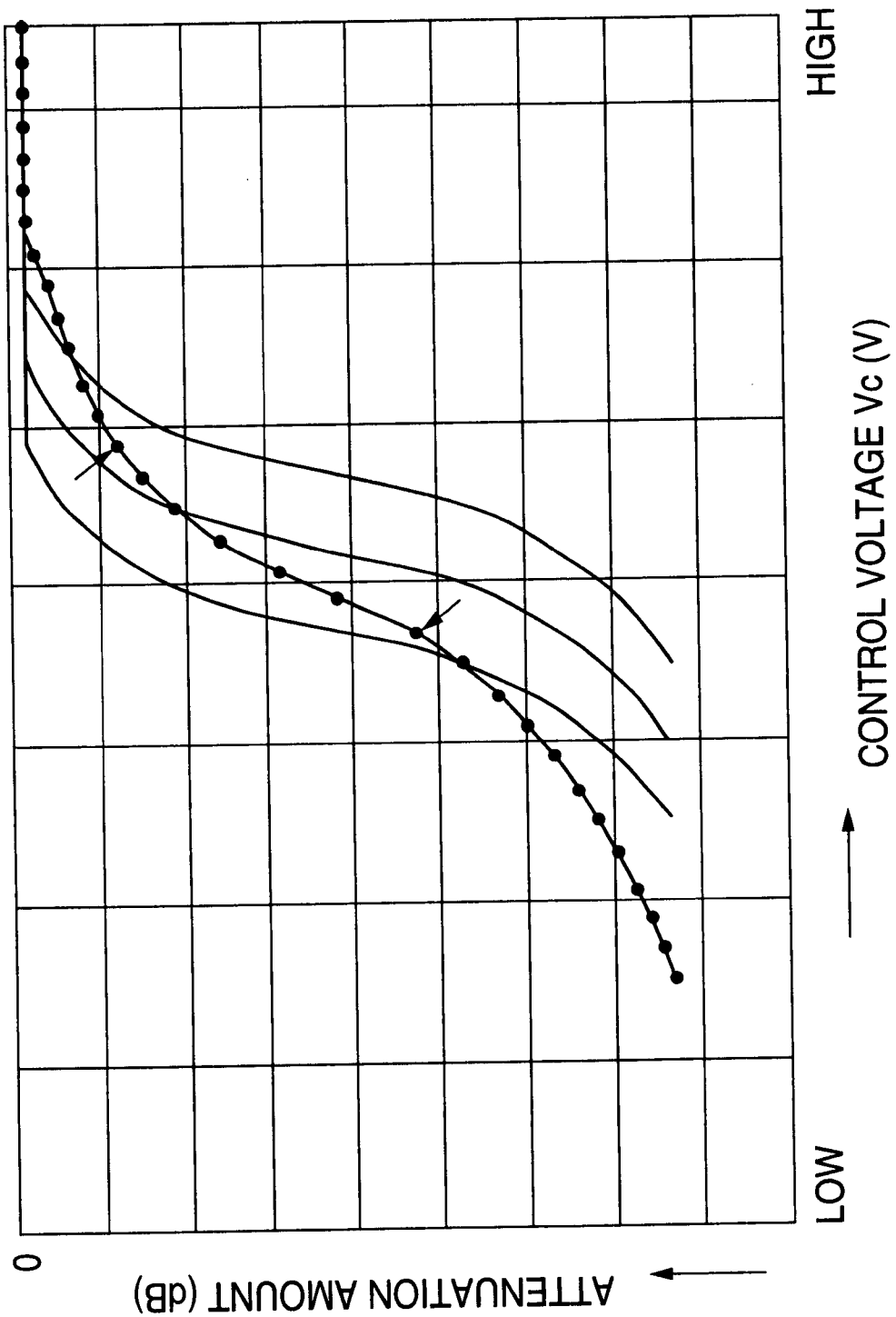
FIG. 6 shows a characteristic of a control voltage versus an attenuating amount of an attenuating circuit in the high-frequency variable attenuator illustrated in FIG. 3.

FIG. 6 shows a characteristic of the control voltage Vc (V) versus the attenuation amount (dB) of the attenuating circuit 12 in the high-frequency variable attenuator 10A illustrated in FIG. 3. In FIG. 6, the abscissa or the X-axis and the ordinate or the Y-axis represent the control voltage Vc (V) and the attenuation amount (dB), respectively.

It is well known in the art that the change in the threshold voltage Vt of the field effect transistor is directly proportional to ambient temperature. Accordingly, it is also possible to correct the attenuation curve to variations of the ambient temperature. As a result, it is possible for the high-frequency variable attenuator 10A to suitably set the attenuation amount in the attenuating circuit 12.

Figure 7:
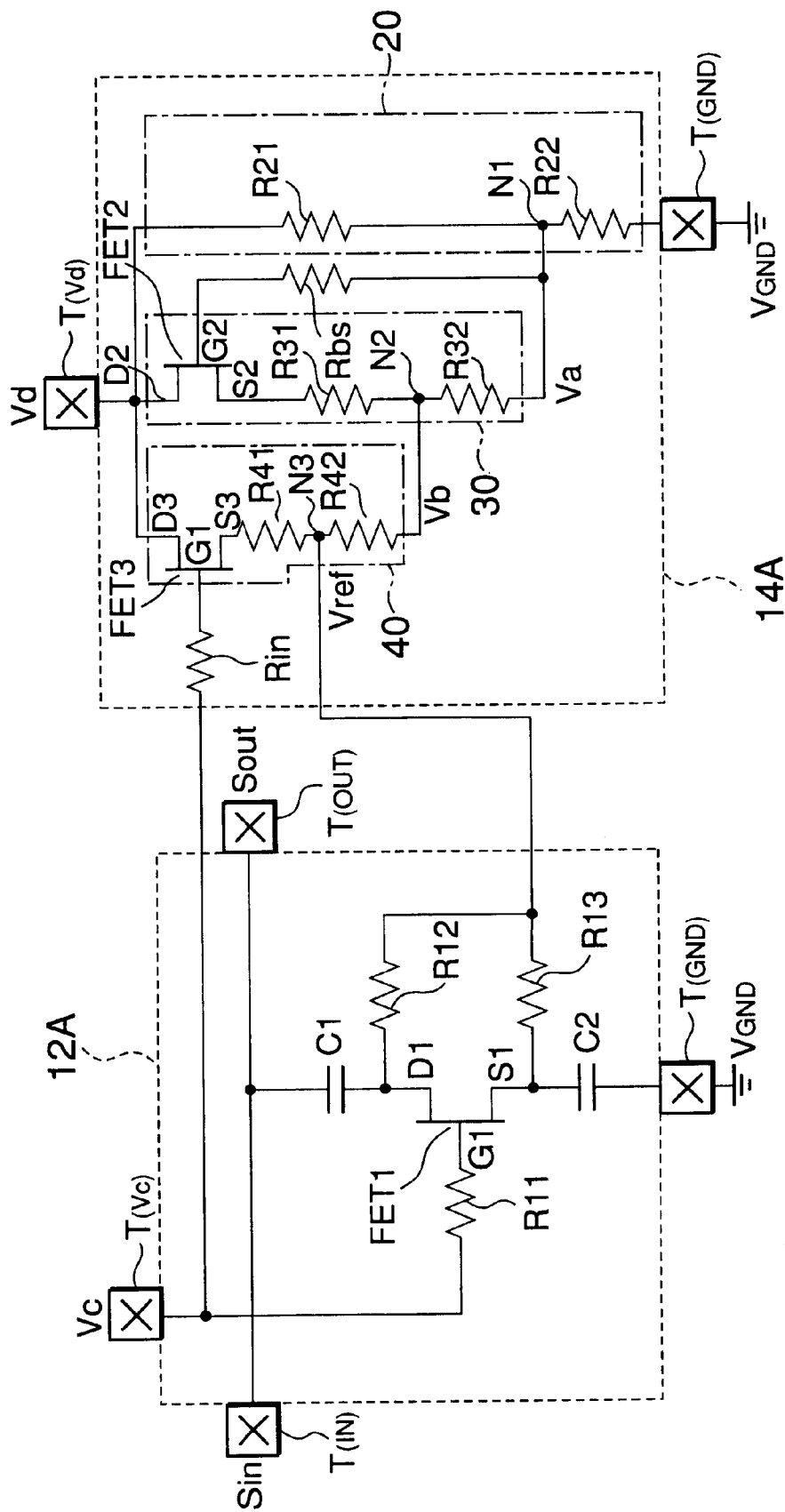
FIG. 7 is a block diagram of a high-frequency variable attenuator according to a second embodiment of this invention.

Referring to FIG. 7, the description will proceed to a high-frequency variable attenuator 10B according to a second embodiment of this invention. The illustrated high-frequency variable attenuator 10B is similar in structure to that illustrated in FIG. 3 except that the attenuating circuit is modified to be different from that described in conjunction with FIG. 3 in the manner which will later become clear. The attenuating circuit is therefore depicted at 12A.

The attenuating circuit 12A has not only the input terminal T(IN), the output terminal T(OUT), and the control terminal T(Vc) but also a ground terminal T(GND) supplied with the ground voltage $V_{GND}$. In the similar manner as the attenuating circuit 12 illustrated in FIG. 3, the attenuating circuit 12A comprises the first field effect transistor FET1, the first through the third attenuator resistors R11, R12, and R13, and the first and the second attenuator capacitors C1 and C2. However, a connection relationship for the terminals is different between the attenuating circuit 12 illustrated in FIG. 3 and the attenuating circuit 12A illustrated in FIG. 7.

More specifically, the first gate terminal G1 of the first field effect transistor FET1 is connected to the control terminal T(Vc) through the first attenuator resistor R11. The first drain terminal D1 of the first field effect transistor FET1 is connected in a shunt fashion through the first attenuator capacitor C11 to the input terminal T(IN) and the output terminal T(OUT). The first source terminal S1 of the first field effect transistor FET1 is connected to the ground terminal T(GND) through the second attenuator capacitor C12. Supplied from the reference voltage generating circuit 14A, the controllable reference voltage Vref is supplied to the first drain terminal D1 and the first source terminal S1 of the first field effect transistor FET1 through the second and the third attenuator resistors R12 and R13, respectively.

With this structure, it is possible to arbitrarily select or determine the attenuation curve indicative of the attenuation amount for the control voltage Vc. In addition, although there are variations in the threshold voltage Vt of the field effect transistor, the ambient temperature, or the like, it is possible to suitably correct the attenuation curve by using the controllable reference voltage Vref supplied from the reference voltage generating circuit 14A. As a result, it is possible for the high-frequency variable attenuator 10B to suitably set the attenuation amount in the attenuating circuit 12A.

In the above-mentioned first and second embodiments, variation in the corrected voltage Vb caused by variation in the threshold voltage Vt of the field effect transistor is obtained by arbitrarily determining the resistance values of the first and the second correction resistors R31 and R32 in a case where the second field effect transistor FET2 has a fixed gate width. Inasmuch as the variation in the corrected voltage Vb is caused by the variation of the threshold voltage Vt in the second field effect transistor FET2 serving as a constant-current source, the variation in the corrected voltage Vb may be obtained by arbitrarily determining a gate voltage of the second field effect transistor FET2.

Figure 8:
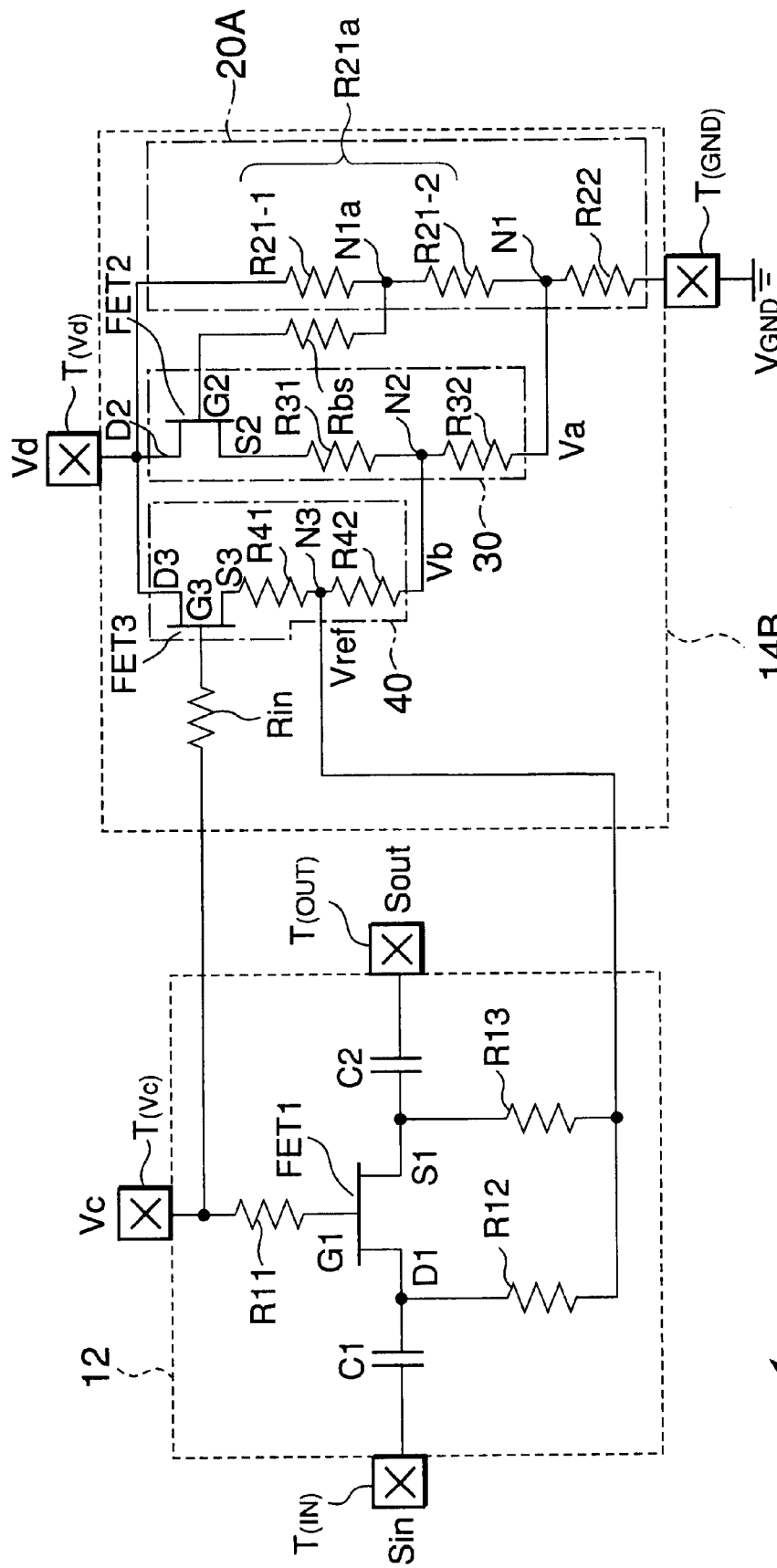
FIG. 8 is a block diagram of a high-frequency variable attenuator according to a third embodiment of this invention.

Referring to FIG. 8, the description will proceed to a high-frequency variable attenuator 10C according to a third embodiment of this invention. The illustrated high-frequency variable attenuator 10C is similar in structure and operation to that illustrated in FIG. 3 except that the reference voltage generating circuit is modified to be different from that described in conjunction with FIG. 3 in the manner which will later become clear. The reference voltage generating circuit is therefore depicted at 14B.

The reference voltage generating circuit 14B can arbitrarily determine the gate voltage of the second field effect transistor FET2. More specifically, the reference voltage generating circuit 14B is similar in structure and operation to the reference voltage generating circuit 13A illustrated in FIG. 3 except that the resistive potential divider is modified to be different from that described in conjunction with FIG. 3 in the manner which will later become clear. The resistive potential divider is therefore depicted at 20A.

The resistive potential divider 20A includes, as the first divider resistor, a variable resistor R21a in lieu of the fixed resistor R21. That is, the resistive potential divider 20A consists of the variable resistor R21a acting as the first divider resistor and the fixed resistor R22 as the second divider resistor. The variable resistor R21a and the fixed resistor R21 are connected in series between the power-supply terminal T(Vd) and the ground terminal T(GND). The variable resistor R21a comprises first and second variable resistor elements R21-1 and R21-2 which are connected in series each other. Specifically, the first variable resistor element R21-1 has an end connected to the power-supply terminal T(Vd) and another end connected to an end of the second variable resistor element R21-2. The second variable resistor element R21-2 has another end connected to the first or the divider reference connection node N1.

Although the variable resistor R21a has a constant or fixed resistance value, each of the first and the second variable resistor elements R21-1 and R21-2 has a variable resistance value. That is, a divided ratio (R21a:R22) of the variable resistor R21a and the fixed resistor R22 is constant. The variable resistor R21a has an additional reference connection node N1a between the first and the second variable resistor elements R21-1 and R21-2 that generates an additional divided voltage. The additional reference connection node N1a is also called a variable reference connection node and the additional divided voltage is therefore called a variable divided voltage. The additional reference connection node N1a is connected to the second gate terminal G2 of the second field effect transistor FET2 through the bias resistor Rbs.

With this structure, it is possible to arbitrarily determine the gate voltage of the second field effect transistor FET2 in the variation correcting circuit 30 by changing the resistance value of the second variable resistor element R21-2. As a result, it is possible to arbitrarily determine a variable amount of the variations in the controllable reference voltage Vref.

While this invention has thus far been described in conjunction with preferred embodiments thereof, it will now be readily possible for those skilled in the art to put this invention into various other manners. For example, although the reference voltage generating circuit comprises both of the variation correcting circuit 30 and the slope determining circuit 40, either of them may be omitted. In other words, the reference voltage generating circuit may comprise either the variation correcting circuit 30 or the slope determining circuit 40.

Figure 9:
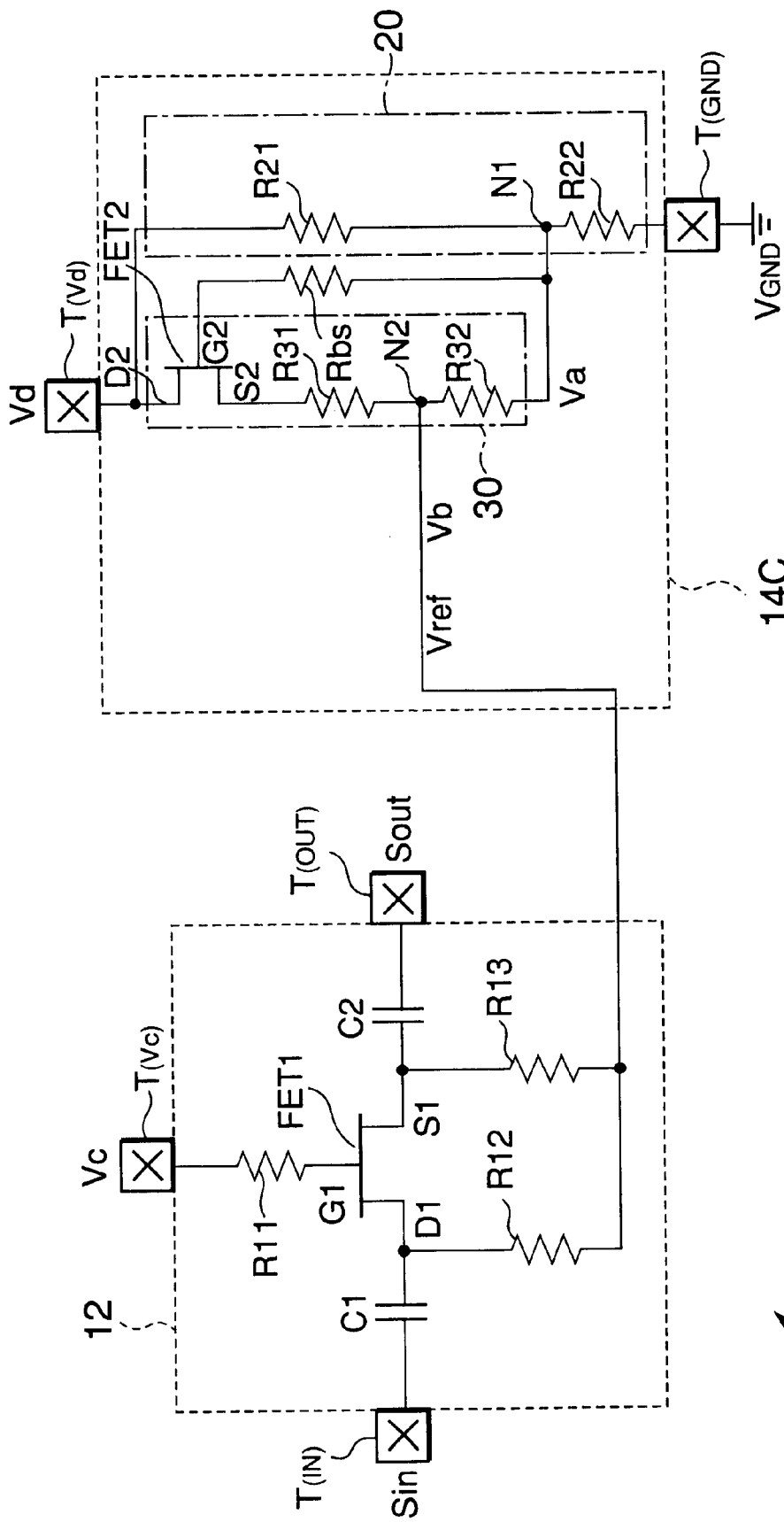
FIG. 9 is a block diagram of a high-frequency variable attenuator according to a fourth embodiment of this invention.

Referring to FIG. 9, the description will proceed to a high-frequency variable attenuator 10D according to a forth embodiment of this invention. The illustrated high-frequency variable attenuator 10D is similar in structure and operation to that illustrated in FIG. 3 except that the reference voltage generating circuit is modified to be different from that described in conjunction with FIG. 3 in the manner which will later become clear. The reference voltage generating circuit is therefore depicted at 14C.

The reference voltage generating circuit 14C is similar in structure and operation to the reference voltage generating circuit 14A illustrated in FIG. 3 except that the slope determining circuit 40 is omitted from the reference voltage generating circuit 14A. In other words, the reference voltage generating circuit 14C consists of the resistive potential divider 20, the bias divider Rbs, and the variation correcting circuit 30. The variation correcting circuit 30 generates, from the correction reference connection node N2, the corrected voltage Vb as the controllable reference voltage Vref.

Figure 10:
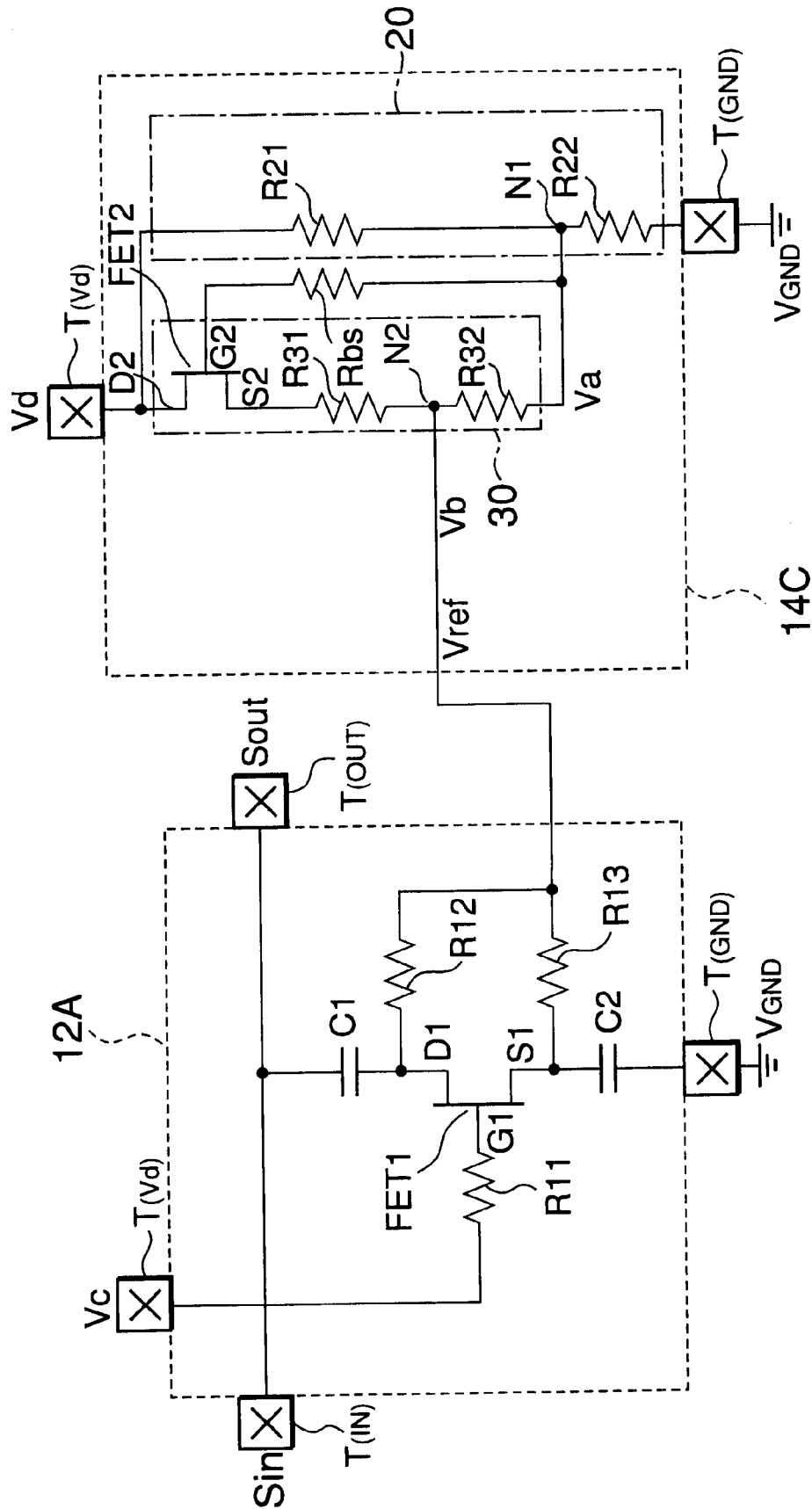
FIG. 10 is a block diagram of a high-frequency variable attenuator according to a fifth embodiment of this invention.

Referring to FIG. 10, the description will proceed to a high-frequency variable attenuator 10E according to a fifth embodiment of this invention. The illustrated high-frequency variable attenuator 10E is similar in structure and operation to that illustrated in FIG. 7 except that the reference voltage generating circuit 14C is modified to be different from that described in conjunction with FIG. 7 in the manner which will later become clear.

The reference voltage generating circuit 14C is similar in structure and operation to the reference voltage generating circuit 14A illustrated in FIG. 7 except that the slope determining circuit 40 is omitted from the reference voltage generating circuit 14A. In other words, the reference voltage generating circuit 14C consists of the resistive potential divider 20, the bias divider Rbs, and the variation correcting circuit 30. The variation correcting circuit 30 generates, from the correction reference connection node N2, the corrected voltage Vb as the controllable reference voltage Vref.

Figure 11:
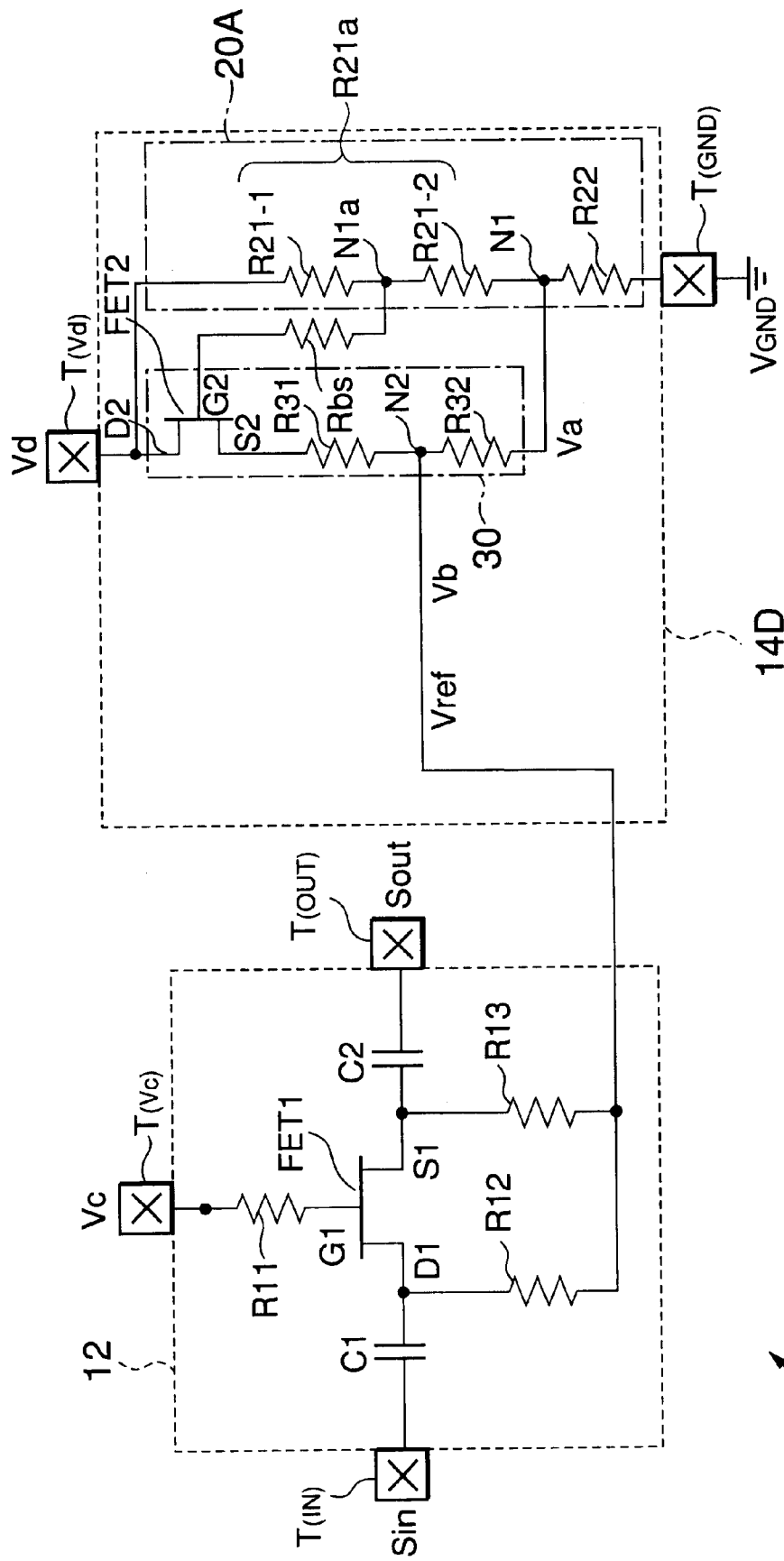
FIG. 11 is a block diagram of a high-frequency variable attenuator according to a sixth embodiment of this invention.

Referring to FIG. 11, the description will proceed to a high-frequency variable attenuator 10F according to a sixth embodiment of this invention. The illustrated high-frequency variable attenuator 10F is similar in structure and operation to that illustrated in FIG. 8 except that the reference voltage generating circuit is modified to be different from that described in conjunction with FIG. 8 in the manner which will later become clear. The reference voltage generating circuit is therefore depicted at 14D.

The reference voltage generating circuit 14D is similar in structure and operation to the reference voltage generating circuit 14B illustrated in FIG. 8 except that the slope determining circuit 40 is omitted from the reference voltage generating circuit 14B. In other words, the reference voltage generating circuit 14B consists of the resistive potential divider 20A, the bias divider Rbs, and the variation correcting circuit 30. The variation correcting circuit 30 generates, from the correction reference connection node N2, the corrected voltage Vb as the controllable reference voltage Vref.

Figure 12:
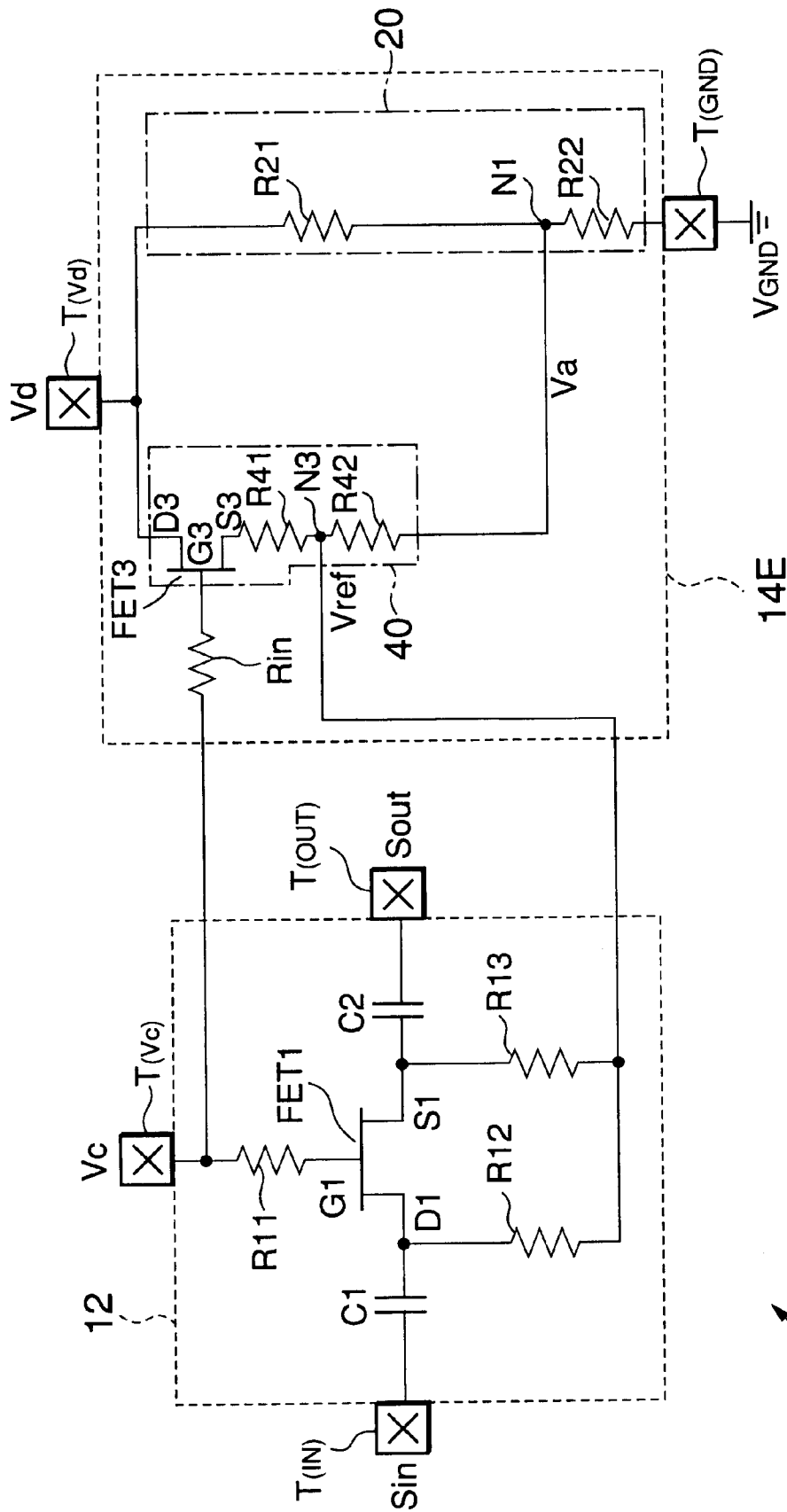
FIG. 12 is a block diagram of a high-frequency variable attenuator according to a seventh embodiment of this invention.

Referring to FIG. 12, the description will proceed to a high-frequency variable attenuator 10G according to a seventh embodiment of this invention. The illustrated high-frequency variable attenuator 10G is similar in structure and operation to that illustrated in FIG. 3 except that the reference voltage generating circuit is modified to be different from that described in conjunction with FIG. 3 in the manner which will later become clear. The reference voltage generating circuit is therefore depicted at 14E.

The reference voltage generating circuit 14E is similar in structure and operation to the reference voltage generating circuit 14A illustrated in FIG. 3 except that the variation correcting circuit 30 is omitted from the reference voltage generating circuit 14A. In other words, the reference voltage generating circuit 14E consists of the resistive potential divider 20, the input resistor Rin, and the slope determining circuit 40. The slope determining circuit 40 is connected between the power-supply terminal T(Vd) and the divider reference connection node N1. That is, the divided voltage Va is directly supplied to the slope determining circuit 40.

Figure 13:
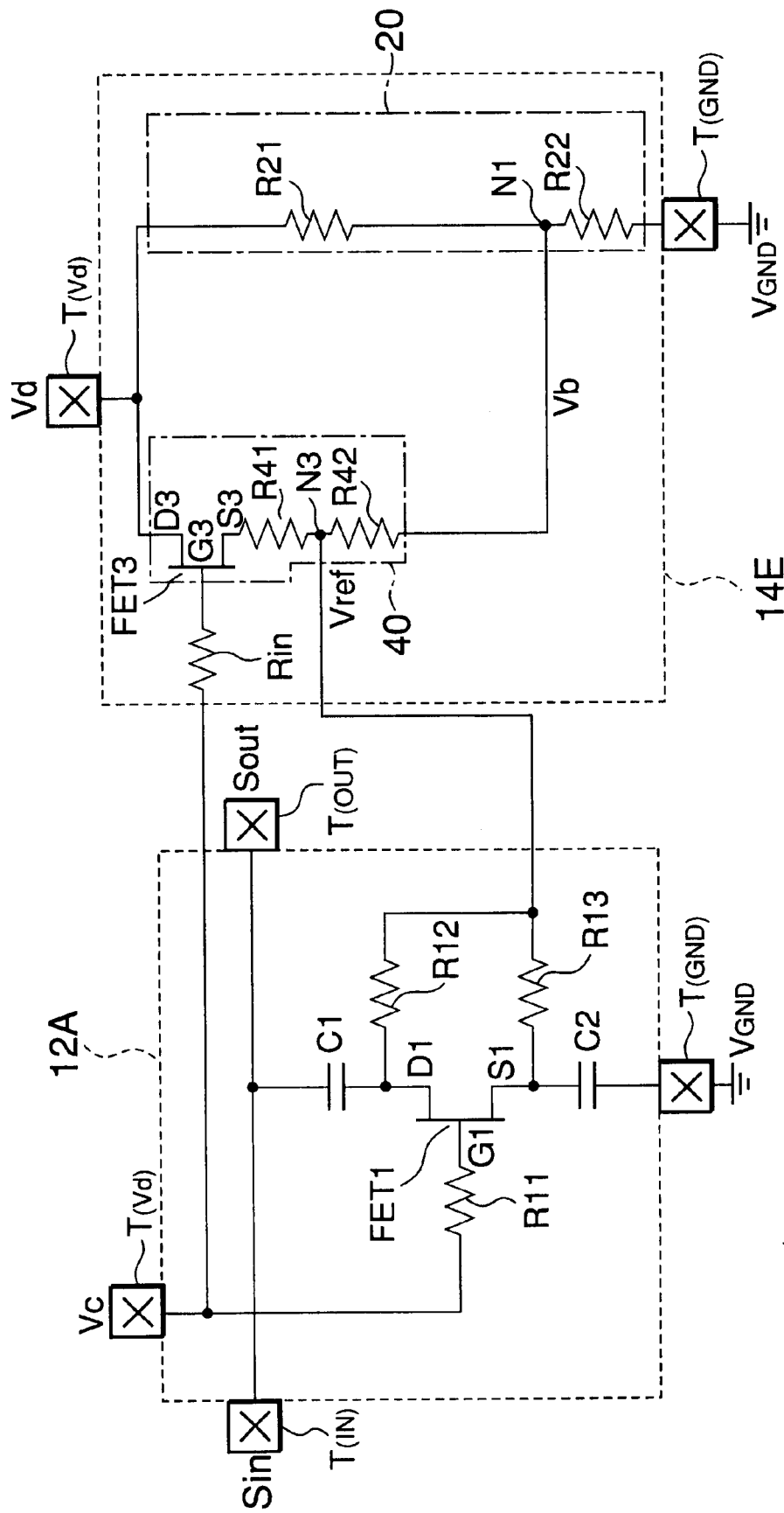
FIG. 13 is a block diagram of a high-frequency variable attenuator according to an eighth embodiment of this invention.

Referring to FIG. 13, the description will proceed to a high-frequency variable attenuator 10H according to an eighth embodiment of this invention. The illustrated high-frequency variable attenuator 10H is similar in structure and operation to that illustrated in FIG. 7 except that the reference voltage generating circuit 14E is modified to be different from that described in conjunction with FIG. 7 in the manner which will later become clear.

The reference voltage generating circuit 14E is similar in structure and operation to the reference voltage generating circuit 14A illustrated in FIG. 7 except that the variation correcting circuit 30 is omitted from the reference voltage generating circuit 14A. In other words, the reference voltage generating circuit 14E consists of the resistive potential divider 20, the input resistor Rin, and the slope determining circuit 40. The slope determining circuit 40 is connected between the power-supply terminal T(Vd) and the divider reference connection node N1. That is, the divided voltage Va is directly supplied to the slope determining circuit 40.

What is claimed is:

1. A high-frequency variable attenuator variably attenuating an input high-frequency signal in response to control voltage to produce an output high-frequency signal, comprising:

a reference voltage generating circuit comprising a node having a fixed resistive path to a ground voltage, and a variable resistive path to a power supply voltage including a field effect transistor having a gate connected to said control voltage, for generating a controllable reference voltage varying in response to said control voltage; and an attenuating circuit having a single field effect transistor, connected to said node of said reference voltage generating circuit, for attenuating said input high-frequency signal on the basis of the control voltage in reference with the controllable reference voltage to produce said output high frequency signal.

2. A high-frequency variable attenuator as claimed in claim 1, wherein said attenuating circuit includes an attenuator field effect transistor having a gate terminal, a drain terminal, and a source terminal, said attenuator field effect transistor having a threshold voltage, said attenuating circuit having an attenuation amount determined by the threshold voltage and a difference voltage between said control voltage and said controllable reference voltage, said attenuation amount being represented by an attenuation curve which depends on said control voltage and said threshold voltage.

3. A high-frequency variable attenuator as claimed in claim 2, said attenuating circuit having an input terminal supplied with said input high-frequency signal, an output terminal for producing said output high-frequency signal, and a control terminal supplied with said control voltage, wherein said attenuating circuit further comprises:

a first attenuator resistor between said control terminal and the gate terminal of said attenuator field effect transistor;

a first attenuator capacitor between said input terminal and the drain terminal of said attenuator field effect transistor;

a second attenuator capacitor between said output terminal and the source terminal of said attenuator field effect transistor;

a second attenuator resistor for supplying said controllable reference voltage with the drain terminal of said attenuator field effect transistor; and a third attenuator resistor for supplying said controllable reference voltage with the source terminal of said attenuator field effect transistor.

4. A high-frequency variable attenuator as claimed in claim 2, wherein said reference voltage generating circuit comprises:

determination means for determining a slope of said attenuation curve in response to said control voltage; and correction means for correcting variations in the threshold voltage.

5. A high-frequency variable attenuator variably attenuating an input high-frequency signal in response to control voltage to produce an output high-frequency signal, comprising:

a reference voltage generating circuit for generating a controllable reference voltage in response to said control voltage; and an attenuating circuit, connected to said reference voltage generating circuit, for attenuating said input high-frequency signal on the basis of the control voltage in reference with the controllable reference voltage to produce said output high frequency signal, wherein said attenuating circuit includes an attenuator field effect transistor having a gate terminal, a drain terminal, and a source terminal, said attenuator field effect transistor having a threshold voltage, said attenuating circuit having an attenuation amount determined by the threshold voltage and a difference voltage between said control voltage and said controllable reference voltage, said attenuation amount being represented by an attenuation curve which depends on said control voltage and said threshold voltage, wherein said reference voltage generating circuit has a power-supply terminals supplied with a power-supply voltage and a ground terminal supplied with a ground voltage, said reference voltage generating circuit being connected to a control terminal supplied with said control voltage, said reference voltage generating circuit comprising:

a resistive potential divider, connected between said power-supply terminal and said ground terminal, for resistively dividing said power-supply voltage, said resistive potential divider having a first reference connection node for generating a divided voltage;

a variation correcting circuit, connected between said power-supply terminal and said first reference connection node, for correcting variations in said threshold voltage, said variation correcting circuit having a second reference connection node for generating a corrected voltage; and a slope determining circuit, connected to said control terminal through an input resistor and connected between said power-supply terminal and said second reference connection node, for determining a slope of said attenuation curve in response to said control voltage, said slope determining circuit having a third reference connection node for generating a determined voltage as said controllable reference voltage.

6. A high-frequency variable attenuator as claimed in claim 5, wherein said resistive potential divider comprises:

a first divider resistor connected between said power-supply terminal and said first reference connection node; and a second divider resistor connected between said first reference connection node and said ground terminal.

7. A high-frequency variable attenuator as claimed in claim 5, wherein said variation correcting circuit comprises:

a correction field effect transistor having a gate terminal connected said first reference connection node through a bias resistor, a drain terminal connected to said power-supply terminal, and a source terminal, said correction field effect transistor having a threshold voltage which is substantially equal to that of said attenuator field effect transistor;

a first correction resistor connected between the source terminal of said correction field effect transistor and said second reference connection node; and a second correction resistor connected between said second reference connection node and said first reference connection node.

8. A high-frequency variable attenuator as claimed in claim 6, wherein said slope determining circuit comprises:

a determination field effect transistor having a gate terminal connected said control terminal through said input resistor, a drain terminal connected to said power-supply terminal, and a source terminal;

a first determination resistor connected between the source terminal of said determination field effect transistor and said third reference connection node; and a second determination resistor connected between said third reference connection node and said second reference connection node.

* * * * *